(12) United States Patent
Takamatsu et al.

(10) Patent No.: US 8,538,632 B2
(45) Date of Patent: Sep. 17, 2013

(54) ELECTRIC POWER STEERING APPARATUS

(75) Inventors: Takanobu Takamatsu, Habikino (JP); Ryouichi Suzuki, Ebina (JP); Yuuichi Fukuyama, Yokohama (JP); Yuji Takatsuka, Kobe (JP)

(73) Assignees: JTEKT Corporation, Osaka (JP); Mitsubishi Electric Corporation, Tokyo (JP)

( * ) Notice: Subject to any disclaimer, the term of this patent is extended or adjusted under 35 U.S.C. 154(b) by 921 days.

(21) Appl. No.: 12/289,102

(22) Filed: Oct. 21, 2008

(65) Prior Publication Data

US 2009/0150027 A1 Jun. 11, 2009

(30) Foreign Application Priority Data

Oct. 23, 2007 (JP) .................................. 2007-274600

(51) Int. Cl.
*B62D 6/00* (2006.01)

(52) U.S. Cl.
USPC .......................................... 701/41; 180/443

(58) Field of Classification Search
USPC ................. 180/400, 443; 701/41, 43, 48, 36; 361/23, 31, 78, 87; 324/612, 512, 522; 307/10.1, 10.6

See application file for complete search history.

(56) References Cited

U.S. PATENT DOCUMENTS

| | | | | |
|---|---|---|---|---|
| 6,392,854 B1 * | 5/2002 | O'Gorman | ...................... | 361/31 |
| 6,519,518 B1 * | 2/2003 | Klein et al. | ...................... | 701/41 |
| 6,679,350 B2 * | 1/2004 | Shimizu et al. | ............... | 180/446 |
| 2005/0016788 A1 * | 1/2005 | Hidaka | ........................ | 180/443 |
| 2005/0159866 A1 * | 7/2005 | Takeuchi et al. | ................ | 701/41 |
| 2008/0140340 A1 * | 6/2008 | Barthomeuf et al. | ......... | 702/151 |

FOREIGN PATENT DOCUMENTS

| | | |
|---|---|---|
| JP | 63-237319 | 10/1988 |
| JP | 07-040849 | 2/1995 |
| JP | 2000-228891 | 8/2000 |
| JP | 2001-008483 | 1/2001 |
| JP | 2005-051839 | 2/2005 |
| JP | 2005-253156 | 9/2005 |
| JP | 2006-182166 | 7/2006 |
| JP | 2006-211825 | 8/2006 |

* cited by examiner

*Primary Examiner* — Tony H. Winner
*Assistant Examiner* — Jacob Knutson
(74) *Attorney, Agent, or Firm* — Clark & Brody

(57) ABSTRACT

An electric power steering apparatus is provided that has a controller by which no current flows in one phase among current paths of three phases for supplying electric power from a motor driving circuit to a three-phase brushless motor and currents that have an identical absolute value and that have different signs flow in the other two phases. Thus, the status at one energization angle on the driving current waveform of the three-phase brushless motor can be given continuously and relatively-high currents can simultaneously flow in opposite directions in the contacts inserted to the two phases. By flowing of such high current in the contacts, a secure conduction check can be performed and foreign matters on the surface of the contact can be fused or thermally destroyed.

7 Claims, 14 Drawing Sheets

ELECTRIC POWER STEERING APPARATUS

BACKGROUND OF THE INVENTION

1. Field of the Invention

The present invention relates to an electric power steering apparatus in which a three-phase brushless motor is used to generate a steering assist force. In particular, the present invention relates to the configuration of the control circuit thereof.

2. Description of the Related Art

An electric power steering apparatus is an apparatus in which a motor is used to generate a steering assist force in accordance with a steering torque caused in a steering shaft. The motor is generally a three-phase brushless motor. The motor is mainly controlled by a CPU and an electronic circuit. When the normal operation of the electric power steering apparatus cannot be guaranteed due to the malfunction of the CPU or the failure of the electronic circuit in the worst case, the motor must be securely stopped. To realize this, a circuit configuration has been used in which a feeding current path to the motor includes a relay contact so that the contact is opened when the CPU or electronic circuit has abnormality to securely stop the feeding to the motor (see Japanese Published Unexamined Patent Application No. 2006-182166 for example).

The above contact must be closed when the electric power steering apparatus operates normally and must be conductive with a favorable electrical conductivity. However, when the surface of the contact is oxidized for example to have thereon an insulating film or when dusts existing at the periphery of the contact or fine abrasion powder of the relay itself for example are attached to the surface of the contact, these foreign matters cause an increase in the contact resistance of the contact, thus reducing the electrical conductivity. The reduced electrical conductivity causes an adverse influence on the motor control. Thus, a function is required to check whether the contact has a favorable electrical conductivity or not when the electric power steering apparatus is started. Another function is also required, in addition to the mere check function, to solve or reduce a minor or temporary reduction in the electrical conductivity to recover a favorable electrical conductivity.

It has been considered effective to remove foreign matters as described above by chattering the contact (see Japanese Published Unexamined Patent Application No. S63-237319 for example). As a part of an initial operation prior to a general motor control, a processing has been suggested in recent years according to which a predetermined voltage small enough not to operate a motor is applied to the motor to remove foreign matters (see Japanese Published Unexamined Patent Application No. 2006-211825 for example).

In the conventional techniques as described above, however, the chattering and voltage application may not remove foreign matters in some cases. Due to the existence of such foreign matters, a mere voltage application finds it difficult to provide a secure conduction check.

SUMMARY OF THE INVENTION

In view of the conventional problems as described above, it is an objective of the present invention to provide an electric power steering apparatus having a configuration in which relay contacts are inserted to at least current paths of two phases among current paths of three phases for supplying electric power to a three-phase brushless motor so that the conduction check of the contacts is securely performed and an improved function is provided to remove foreign matters on the surface of the contact to recover a favorable electrical conductivity.

In order to achieve the above objective, an electric power steering apparatus using a three-phase brushless motor to generate a steering assist force, comprises: a motor driving circuit for supplying electric power to the three-phase brushless motor; a relay that can open or close contacts respectively inserted to at least current paths of two phases among current paths of three phases for supplying electric power from the motor driving circuit to the three-phase brushless motor; a current detector for detecting respective currents flowing in the current paths having the contact inserted; and a controller for closing the respective contacts and making a condition that no current flows in the current path of one of three phases whereas currents having an identical absolute value with positive and negative signs different from each other flow in the current paths of the other two phases, the controller performing a conduction check process for the contacts under the aforementioned condition by the current detector actually detecting current flowing in at least one phase of current paths having the contact inserted.

In the electric power steering apparatus having the configuration as described above, no current flows in a current path of one phase and currents having an identical absolute value and having different positive and negative signs flow in the current paths of the other two phases. Thus, the status at one energization angle on the driving current waveform of the three-phase brushless motor can be given continuously and relatively-high currents can simultaneously flow in the contacts inserted to the current paths of the two phases. By flowing of such high current in the contacts, the conduction check can be performed securely. The flow of such high current also can fuse or thermally destroy metal foreign matters on the surface of the contact. Thus, an improved function can be provided to remove foreign matters on the surface of the contact to recover a favorable electrical conductivity.

In the above electric power steering apparatus, the contacts are inserted only to current paths of two phases among the current paths of the three phases, respectively, and "the current path of any one phase" may be a current path of one phase having no contact inserted.

In this case, a waste can be excluded that is caused by the current for investigating electrical conductivity in a current path including no contact.

In the above electric power steering apparatus, the controller preferably determines the positive and negative signs of currents flowing in the respective current paths of the two phases such that a rotation angle of the rotor from the current position is minimum.

The status in which no current flows in a current path of a phase including no contact and currents having an identical absolute value and different positive and negative signs flow in the current paths of the other two phases appears whenever the electric angle of 180 degrees is reached. The current position of the rotor is not fixed. Thus, although the flow of current rotates the rotor to a position corresponding to the energization angle, the positive and negative signs of the current determined so as to achieve the minimum rotation angle from the current position can allow the rotor at an arbitrary current position to be positioned at 90 degrees to the nearest electric angle at maximum, thus limiting the rotation angle of the rotor.

The above electric power steering apparatus may include a reducer and a value obtained by multiplying a reduction ratio with a motor pole number may be 90 or more.

By selecting the reduction ratio to the motor pole number so as to satisfy the conditions as described above, even when the rotor is rotated with the electric angle of 90 degrees at maximum, the rotation of the steering wheel can be limited to 2 degrees or less. The rotation of 2 degrees or less is difficulty noticed by the driver. Specifically, even when the steering wheel is slightly rotated due to the conduction check process at the contact, the driver can be suppressed from noticing this to feel uncomfortable.

In the above electric power steering apparatus, the contacts may be inserted to all of the current paths of the three phases, respectively.

The controller may perform the conduction check process based on two stages among which a first stage is performed by the controller to carry out the conduction check process by using one phase that has an electric angle nearest to the current position of the rotor and that has a current value of 0 on a driving current waveform of the three-phase brushless motor as a current path in which no current flows and a second stage is performed by the controller to carry out the conduction check process by using the other one phase that has an electric angle nearest to the electric angle in the first stage and that has a current value of 0 of the other one phase as a current path in which no current flows.

In this case, the processing of the two stages can investigate the electrical conductivities of all of the contacts inserted to the current paths of the three phases. Furthermore, the rotation angle of the rotor can be suppressed to a smaller value because the conduction check process can be performed without being limited by a specific phase and while the three phases being energized at an energization angle that is nearest to the current position of the rotor and at which one phase has a current value of 0. Since the zero point exists at every 60 degrees of an electric angle, the rotation angle of the rotor also can be within the electric angle of 60 degrees.

In the above electric power steering apparatus, the contacts are inserted to all of the current paths of the three phases, respectively.

The controller performs the conduction check process based on two stages among which a first stage is performed by the controller to carry out the conduction check process by using a first phase as a current path in which no current flows and a second stage is performed by the controller to carry out the conduction check process by using any one phase among a second phase and a third phase as a current path in which no current flows.

In this case, the processing of the two stages can investigate the electrical conductivities of all of the contacts inserted to the current paths of the three phases. Even when phases for which no current flows are selected based on a previously-determined order, electric angles for which the current value of any phase of the three phases on the driving current waveform of the three-phase brushless motor is 0 exist within the electric angle of 180 degrees. Thus, the rotor is rotated with the electric angle of 90 degrees at maximum. Thus, the rotation angle of the rotor can be within the range of the electric angle of 90 degrees.

DESCRIPTION OF THE PREFERRED EMBODIMENTS

First Embodiment

Figure 1:
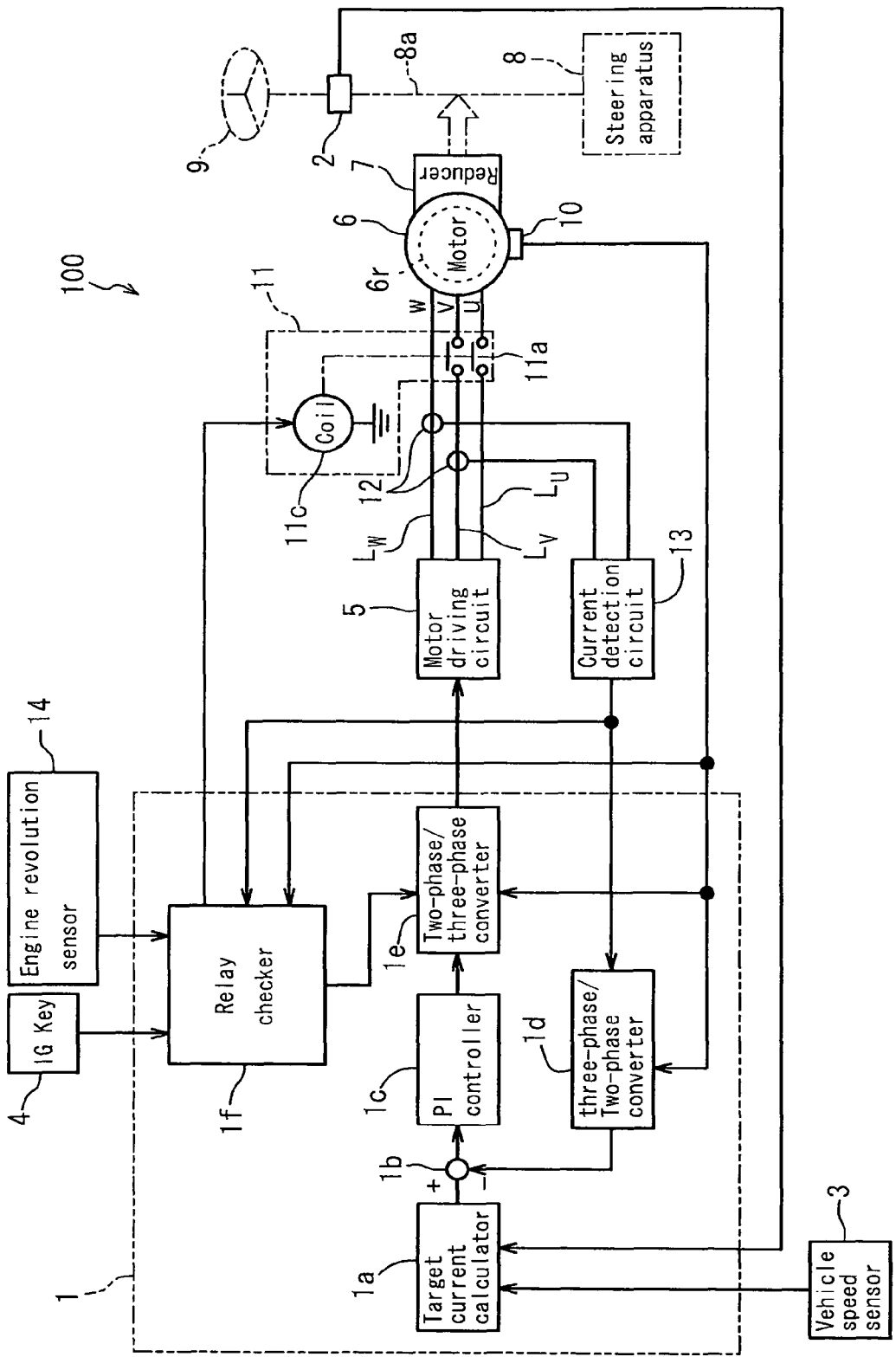
FIG. 1 is a block diagram illustrating the circuit configuration of an electric power steering apparatus according to the first embodiment of the present invention.

FIG. 1 is a block diagram illustrating the circuit configuration of an electric power steering apparatus 100 according to the first embodiment of the present invention. In FIG. 1, a controller 1 configured to include a CPU receives a steering torque signal from a torque sensor 2, a vehicle speed signal from a vehicle speed sensor 3, an ON signal from an ignition key (IG key) 4, and an engine revolution signal from an engine revolution sensor 14, respectively. The controller 1 drives a three-phase brushless motor (hereinafter called motor) 6 via a motor driving circuit 5. The motor driving circuit 5 includes a known PWM circuit for subjecting a signal sent from the controller 1 to a pulse width modification (PWM) and a three-phase bridge circuit (inverter circuit) and converts electric power supplied from a power source (not shown) to alternate current electric power of three phases of U, V, and W to supply the power to the motor 6 to drive the motor 6.

The motor 6 is connected to a steering axis 8a of a steering apparatus 8 via a reducer 7 and gives a steering assist force to the steering axis 8a. The steering axis 8a is connected to a steering wheel (handle) 9 and the torque sensor 2 is provided at the middle therebetween. The motor 6 has a rotation angle sensor 10 to send a rotation angle signal of a rotor 6r to the controller 1. When assuming that the current paths of the three phases (U, V, and W) connecting the motor driving circuit 5 to the motor 6 are $L_U$, $L_V$, and $L_W$, a contact 11a of a relay 11 is provided at the middle of the current paths $L_U$ and $L_V$ among the current paths $L_U$, $L_V$, and $L_W$, respectively.

The current paths $L_V$ and $L_W$ have a current sensor 12. Based on the output from the current sensor 12, a current detection circuit 13 detects the current flowing in the current paths $L_V$ and $L_W$ to detect, based on the current flowing in the current paths $L_V$ and $L_W$, the current flowing in the current path $L_U$ by calculation to send these detection outputs to the controller 1. The current sensor 12 and the current detection circuit 13 constitute a current detector. The current sensor 12 may be a shunt resistance, a Hall element, a Hall IC, or a current probe for example.

The controller 1 includes, as an internal function realized by software, a target current calculator 1a, a comparator 1b, a PI controller 1c, a three-phase/two-phase converter 1d, a two-phase/three-phase converter 1e, and a relay checker 1f. The steering torque signal from the torque sensor 2 and the vehicle speed signal from the vehicle speed sensor 3 are inputted to the target current calculator 1a. The signal from the rotation angle sensor 10 is inputted to the three-phase/two-phase converter 1d and the two-phase/three-phase converter 1e and is also inputted to the relay checker 1f. The output from the current detection circuit 13 is inputted to the three-phase/two-phase converter 1d and the relay checker 1f. The signal from the ignition key 4 and the signal from the engine revolution sensor 14 are inputted to the relay checker 1f. The relay checker 1f gives a control signal to a coil 11c of the relay 11 and the two-phase/three-phase converter 1e.

In the control during the normal operation of the electric power steering apparatus 100 (so-called assist control to output a torque for assisting the operation of a steering wheel 9 by a driver), the target current calculator 1a calculates, based on the steering torque signal from the torque sensor 2 and the vehicle speed signal from the vehicle speed sensor 3, the target current of the axis d and the axis q to be given to the motor 6. The three-phase/two-phase converter 1d uses the rotation angle detected by the rotation angle sensor 10 to convert the currents of the phases U, V, and W to the current of the axis d and the current of the axis q. Then, the comparator 1b compares the target current of the axis d and the target current of the axis q with the current of the axis d and the current of the axis q, respectively to carry out a feedback control. Specifically, the control is carried out such that the current of the axis d and the current of the axis q are close to the target current of the axis d and the target current of the axis q, respectively.

The output from the comparator 1b is subjected to a proportional-integral control by the PI controller 1c and the resultant output is converted by the two-phase/three-phase converter 1e to instruction values of currents of the phases U, V, and W. Based on the instruction values, the motor driving circuit 5 supplies current to the motor 6. During the assist control, the relay 11 is always excited based on the instruction from the relay checker 1f and the contacts 11a thereof are closed so long as any abnormality occurs.

Figure 4:
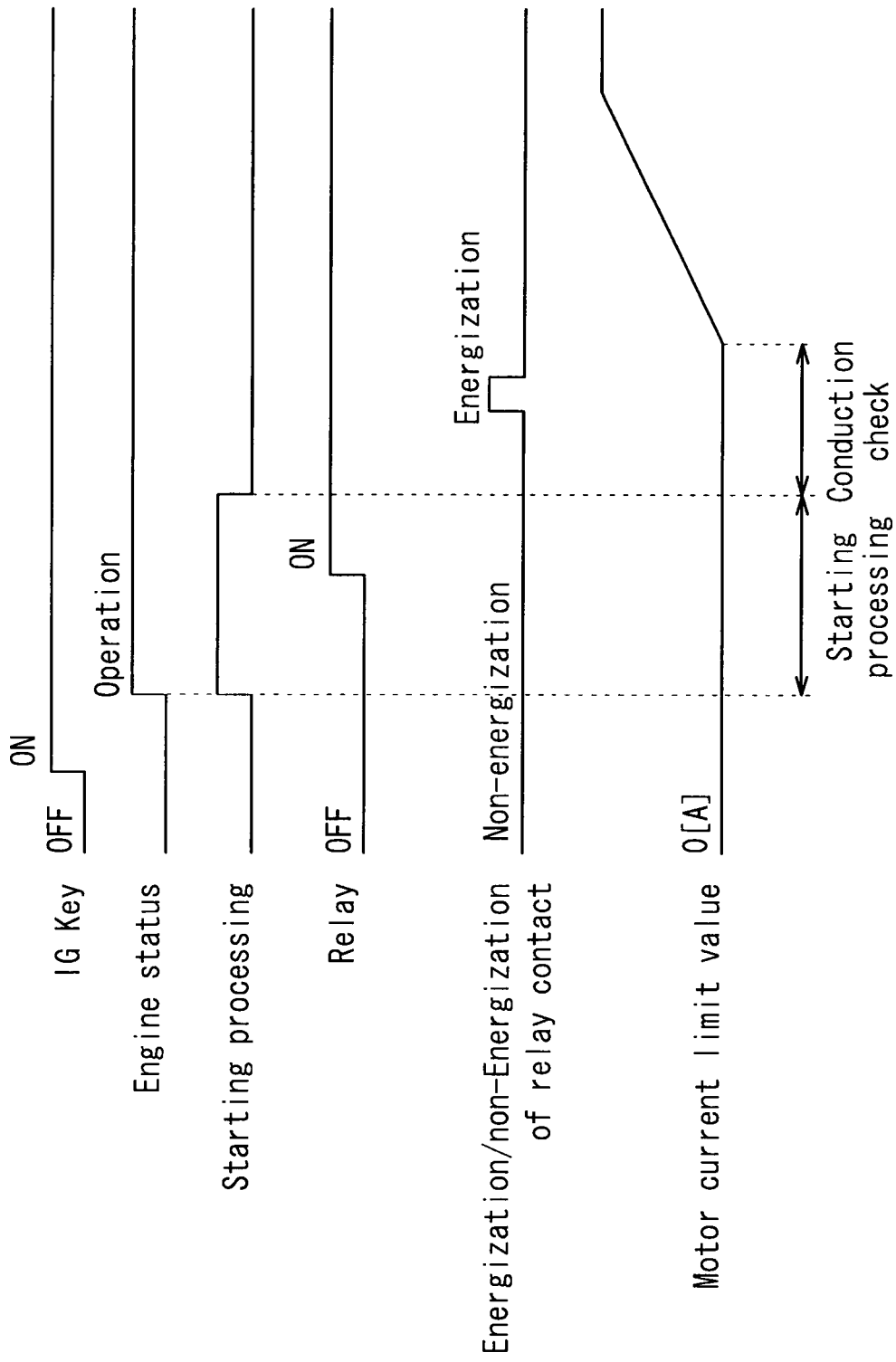
FIG. 4 is a time chart illustrating the control operation prior to the assist control together with the operations of the respective related sections and showing a case where one conduction check process is carried out.
Figure 5:
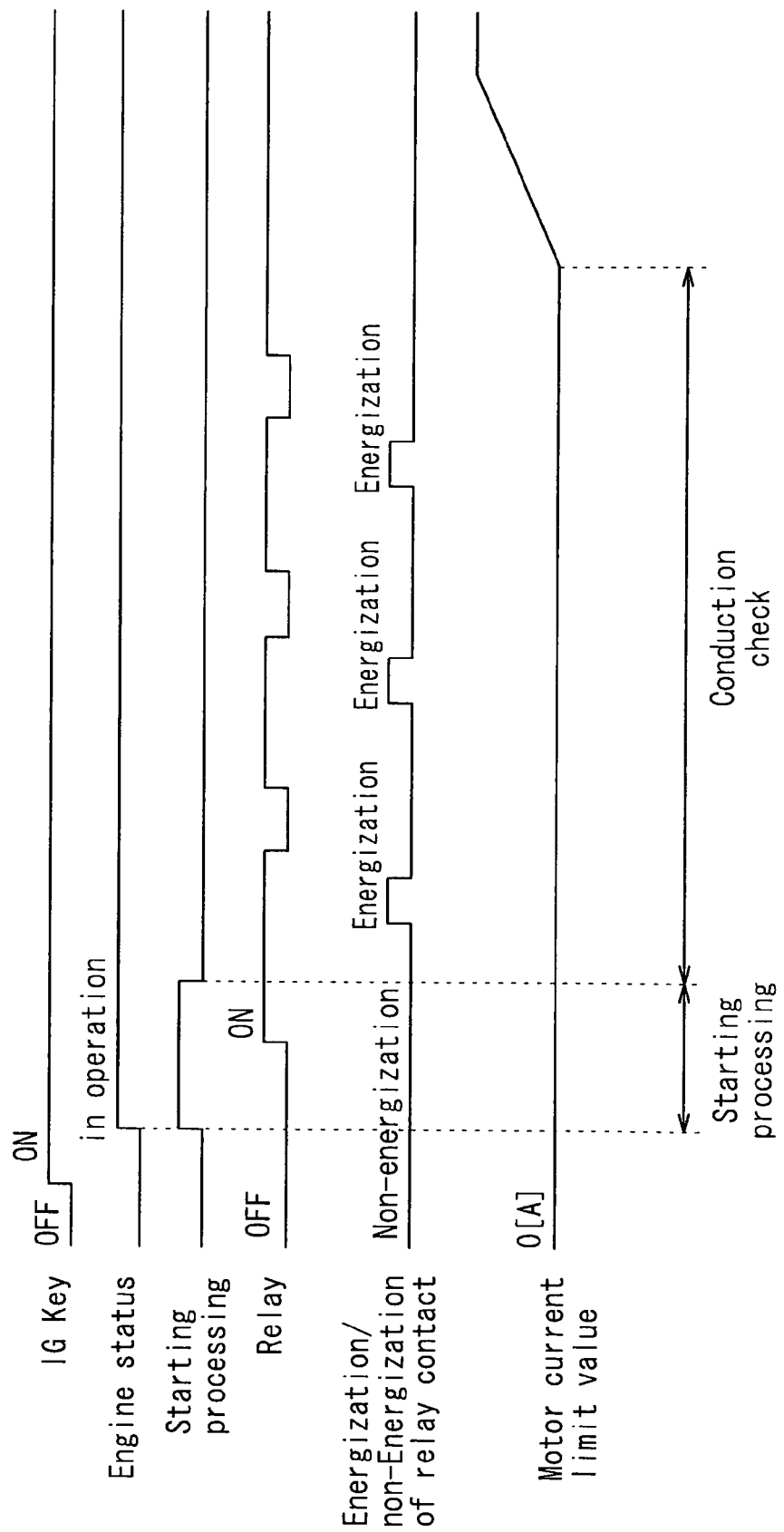
FIG. 5 is a time chart illustrating the control operation prior to the assist control together with the operations of the respective related sections and showing a case where a plurality of conduction check processes are carried out.

Next, the conduction check process prior to the normal assist control as described above will be described with reference to the flowchart of FIG. 3 and the time charts of FIG. 4 and FIG. 5. First, in FIG. 4, when an ignition key 4 is turned ON to subsequently start the engine and an engine revolution signal is inputted from the engine revolution sensor 14, the engine status shows an in-operation status and the controller 1 performs a starting processing (self initial check) for a predetermined time to subsequently subject the contacts 11a of the relay 11 to the conduction check process.

Figure 3:
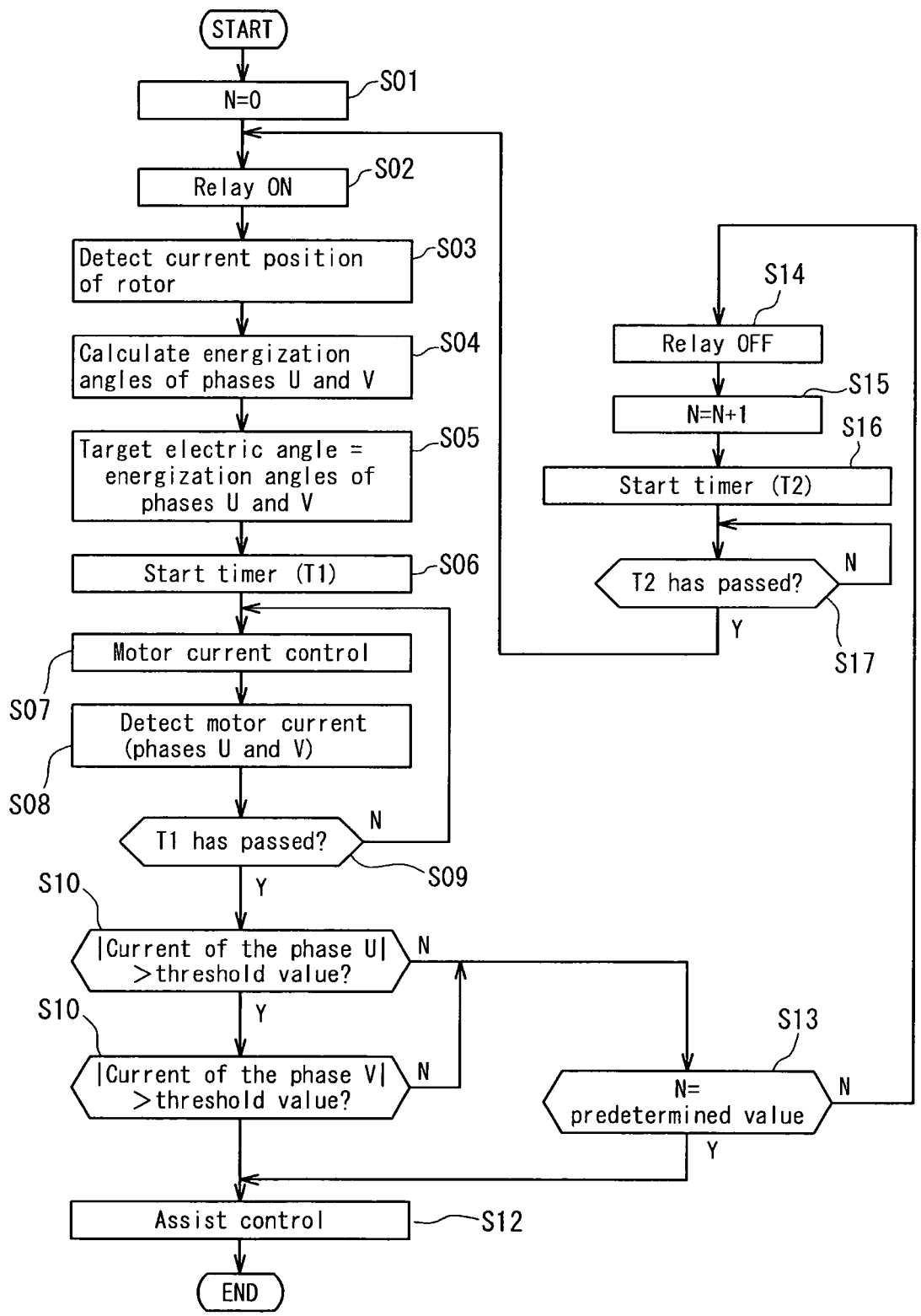
FIG. 3 is a flowchart illustrating a control operation that is carried out by a controller of the electric power steering apparatus and that is performed prior to an assist control.

In FIG. 3 (also refer to FIG. 1), after the starting processing, the controller 1 (mainly the function of the relay checker 1f) sets an initial value of the count value N to 0 (Step S01). Next, the controller 1 excites the relay 11 to close the contacts 11a (Step S02).

Next, based on the output from the rotation angle sensor 10, the controller 1 detects the current position of the rotor 6r (Step S03).

Figure 2:
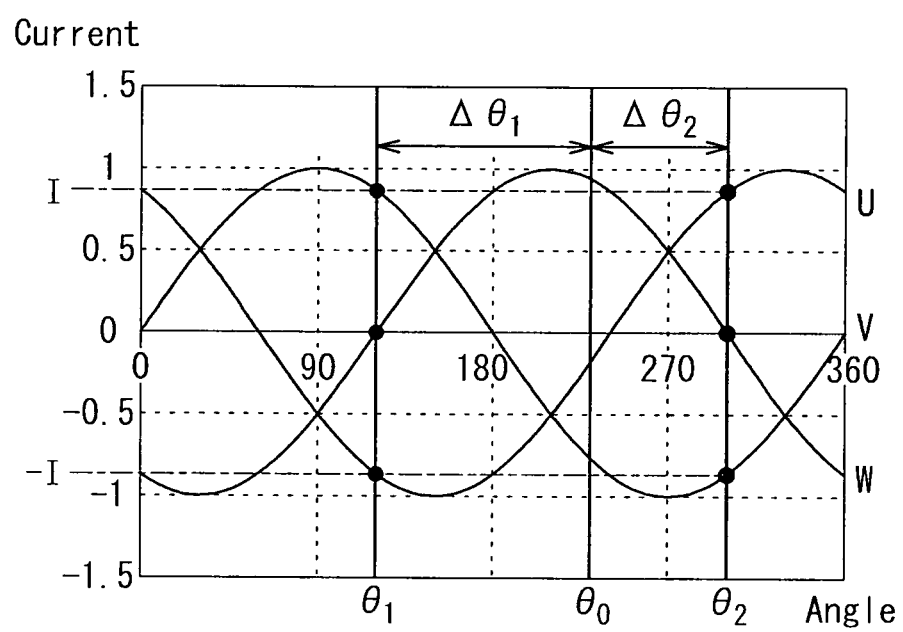
FIG. 2 illustrates driving current waveforms (i.e., field current waveforms) of three phases (U, V, and W) of a motor in which the horizontal axis shows an electric angle and the vertical axis shows a current amplitude ratio and illustrates a basic concept of a conduction check process in the electric power steering apparatus according to the first embodiment.

FIG. 2 illustrates driving current waveforms (i.e., field current waveforms (ideal waveforms)) of the three phases (U, V, and W) of the motor 6 in which the horizontal axis shows electric angles (energization angles) and the vertical axis shows current amplitude ratios. The rotor 6r is rotated in synchronization with a change in the field current. Thus, the position of the rotor 6r (electric angle) can have a one-to-one correspondence to the field currents of three phases. Then, electric angles of $\theta_1$ (120 degrees) and $\theta_2$ (300 degrees) are found that satisfy the conditions according to which the maximum amount of the currents flows at the phases U and V and no unnecessary current flows at the phase W having no contact 11a. At these electric angles, among the current paths of the three phases, the current path $L_W$ of the phase W including no contact 11a includes no flow of current and the current paths $L_U$ and $L_V$ of the other two phases (U and V) includes flows of currents that have an identical absolute value and that have different positive and negative signs (hereinafter merely referred to as sign). Specifically, in the three-phase brushless motor, the total of the current values of the three phases of U, V, and W during the driving is 0. Thus, at an electric angle at which any one phase of the three phases (the phase W in this case) has to the current value of 0, the other two phases (the phase U and the phase V in this case) correspond have the flow of currents that have an identical absolute value and that have different signs.

When the rotor 6r detected based on the output from the rotation angle sensor 10 is currently positioned with the electric angle $\theta_0$ and the current value I is a positive value and the current of $-I[A]$ flows at the phase U, the current of I[A] flows at the phase V, the current of 0[A] flows at the phase W, the rotor 6r is rotated from $\theta_0$ to $\theta_1$ (rotation angle $\Delta\theta_1$). When the current of I[A] flows at the phase U, the current of $-I[A]$ flows at the phase V, and the current of 0[A] flows at the phase W on the contrary, the rotor 6r is rotated from $\theta_0$ to $\theta_2$ (rotation angle $\Delta\theta_2$). In this case, the rotation angle $\Delta\theta_2$ is smaller than $\Delta\theta_1$. Specifically, the rotor 6r should be rotated from $\theta_0$ to $\theta_2$ in order to minimize the rotation angle of the rotor 6r.

Thus, the controller 1 calculates energization angles ($\theta_1$ and $\theta_2$) at which no current flows in the current path $L_W$ of the phase W and currents that have an identical absolute value and that have different signs flow in the current paths $L_U$ and $L_V$ of the other two phases (U and V) (Step S04). Then, the controller selects, from among the calculated energization angles, the energization angle ($\theta_2$) nearest to the current position (electric angle) of the rotor 6r to set the energization angle as a target electric angle (Step S05).

Then, the controller 1 starts an internal timer (set time T1) (Step S06) to control the motor current (Step S07). This control is performed by allowing the relay checker 1f to instruct the two-phase/three-phase converter 1e to control the motor driving circuit 5 so that the current of I[A] flows at the phase U, the current of −I[A] flows at the phase V, and the current of 0[A] flows at the phase W, respectively. The currents actually flowing in the current paths $L_U$ and $L_V$ of the phases U and V are detected by the output from the current detection circuit 13 (Step S08). By the flow of current as described above, the rotor 6r is rotated to the position at the electric angle $\theta_2$.

The above current I[A] is on the order of a few amperes for example. By flowing of such high current, the conduction check can be performed securely. Even when the surface of the contact 11a has thereon metal foreign matters or an oxide layer, the metal foreign matters or oxide layer can be fused or can be thermally destroyed and can be removed. This energization of current is continuously performed until the set time T1 is passed (Step S09). When the set time T1 has passed since the start of the flow of the current, the controller 1 determines, with regard to the phase U and the phase V respectively, whether the absolute values of the currents exceed the threshold value or not (Steps S10 and S11). When the current absolute values both exceed the threshold value, the controller 1 determines that each contact 11a has a favorable conduction to complete the conduction check process to subsequently start a normal assist control (Step S12). The above threshold value may be set to be lower than the absolute values of the currents I and −I in consideration of a factor that how much the absolute value of the current I flowing at the phases U and V is reduced when any one of the contacts 11a has an increased contact resistance and has an abnormal value.

When any one of the currents for the phase U and the phase V is equal to or lower than the threshold value on the other hand, whether N reaches a predetermined value or not is determined (Step S13). The value N means the number of execution of the conduction check process (and a foreign matter removal processing) by closing the contacts 11a to pass high current. The value N is set to an integer of 2 or more. When the value N in Step S13 does not reach the predetermined value, the controller 1 once returns the relay 11 to a not-excited status (Step S14) and increases the value N by one (Step S15) to start the internal timer (set time T2) (Step S16) to wait when the time T2 is passed (Step S17). Specifically, the time T2 is a waiting time for waiting when the relay 11 is not excited and the contacts 11a are securely opened. When this waiting time T2 has passed, the controller 1 returns to Step S02 to excite the relay 11 again. Thereafter, the same processing is repeated until the value N reaches the predetermined value.

When the repetition of the conduction check process results in the currents of the phase U and the phase V having an absolute value exceeding the threshold value, the controller 1 starts the assist control (Step S12). When the value N reaches the predetermined value while the currents of the phase U and the phase V still having an absolute value equal to or lower than the threshold value on the other hand, the controller 1 also starts the assist control (Step S12). In this case, the determination of "YES" in Step 13 also may be followed by a step of providing an alarm display showing that the contact 11a has a defective electrical conductivity.

When the contacts 11a have a normal electrical conductivity, the absolute values of the currents of the phase U and the phase V both exceed the threshold value. Thus, only one energization is performed and the assist control is started. Thus, the time chart is as shown in FIG. 4. After the energization of the contacts 11a, the controller 1 increases a motor current limiter value in the motor driving circuit 5. Thus, the motor driving circuit 5 can cope with the assist control.

When any one of the contacts 11a has an abnormal electrical conductivity on the other hand, until the absolute values of the currents of the phase U and the current of the phase V both exceeds the threshold value (or until the conduction check process is performed N times), energization is repeated intermittently to subsequently start the assist control. Thus, the time chart is as shown in FIG. 5 for example. After the contacts 11a are energized a plurality of times (three times in this case), the controller 1 increases the motor current limiter value in the motor driving circuit 5. As a result, the motor driving circuit 5 can cope with the assist control.

As described above, in the electric power steering apparatus according to the first embodiment, no current flows in the current path $L_W$ of the phase W including no contact 11a, and currents that have an identical absolute value and that have different signs flow in the current paths $L_U$ and $L_V$ of the phases U and V. Thus, the status at one energization angle on the driving current waveform of the motor 6 can be given continuously and relatively-high currents can simultaneously flow in the contacts 11a inserted to the phases U and V. The flow of high current in the contacts 11a as described above can provide a secure conduction check. At the same time, metal foreign matters can be fused or an oxide layer can be thermally destroyed. Specifically, an improved function can be provided to remove foreign matters on the surface of the contact to recover a favorable electrical conductivity.

The above embodiment has performed the conduction check based on the values of the currents of the phase U and the phase V, respectively. However, when the value of the current of one phase is 0 in the three-phase brushless motor, the values of the currents of the other two phases have an identical absolute value. Thus, the conduction check also may be performed based on the current value of any one of the phase U and the phase V.

The status in which no current flows in the current path $L_W$ of the phase W including no contact 11a, and currents having an identical absolute value and different signs flow in the current paths $L_U$ and $L_V$ of the other two phases appears whenever the electric angle of 180 degrees is reached (see FIG. 2). On the other hand, the current position of the rotor 6r is not fixed and, when current flows, the rotor 6r is rotated to a position corresponding to the energization angle. However, by determining the signs of the currents flowing in the current paths $L_U$ and $L_V$ of the two phases so as to minimize the rotation angle from the current position, an angle from the rotor 6r at an arbitrary current position to the nearest electric angle is 90 degrees at maximum, thus suppressing the rotation angle of the rotor 6r.

The rotation of the rotor 6r results in the rotation of the steering wheel 9 via the reducer 7. When the rotation angle of the steering wheel 9 is large, the driver may notice the large rotation angle and may feel this uncomfortable. An experiment showed that the rotation angle of the steering wheel 9 that is difficulty noticed by the driver is 2 degrees or less. Thus, the reduction ratio R of the reducer 7 may be selected so that the rotation angle of the steering wheel 9 is 2 degrees or less when the rotor 6r is rotated by the electric angle of 90 degrees.

When the motor pole number is 8 (4 cycles of electric angles) for example, $$(90/4) \times (1/R) \leq 2 \tag{1}$$

Specifically, $$90 \leq 8R \tag{2}$$

Thus, the reduction ratio R satisfying the formulae (1) and (2) is 11.25 or more.

When the motor pole number is 4 (2 cycles of electric angles), $$(90/2) \times (1/R) \leq 2 \quad (3)$$

Specifically, $$90 \leq 4R \quad (4)$$

Thus, the reduction ratio R satisfying the formulae (3) and (4) is 22.5 or more.

As can be seen from the formulae (2) and (4), conditions for providing the rotation angle of the steering wheel 9 of 2 degrees or less are that (motor pole number)×(reduction ratio) is 90 degrees or more. By selecting the reduction ratio so as to satisfy the conditions as described above, the rotation of the steering wheel 9 can be limited to 2 degrees or less even when the rotor 6r is rotated with an electric angle of 90 degrees at maximum. The rotation of the steering wheel 9 of 2 degrees or less is difficulty noticed by the driver. Specifically, even when the steering wheel 9 is slightly rotated due to the conduction check process at the contact 11a, the driver can be suppressed from noticing this to feel uncomfortable.

Second Embodiment

Figure 6:
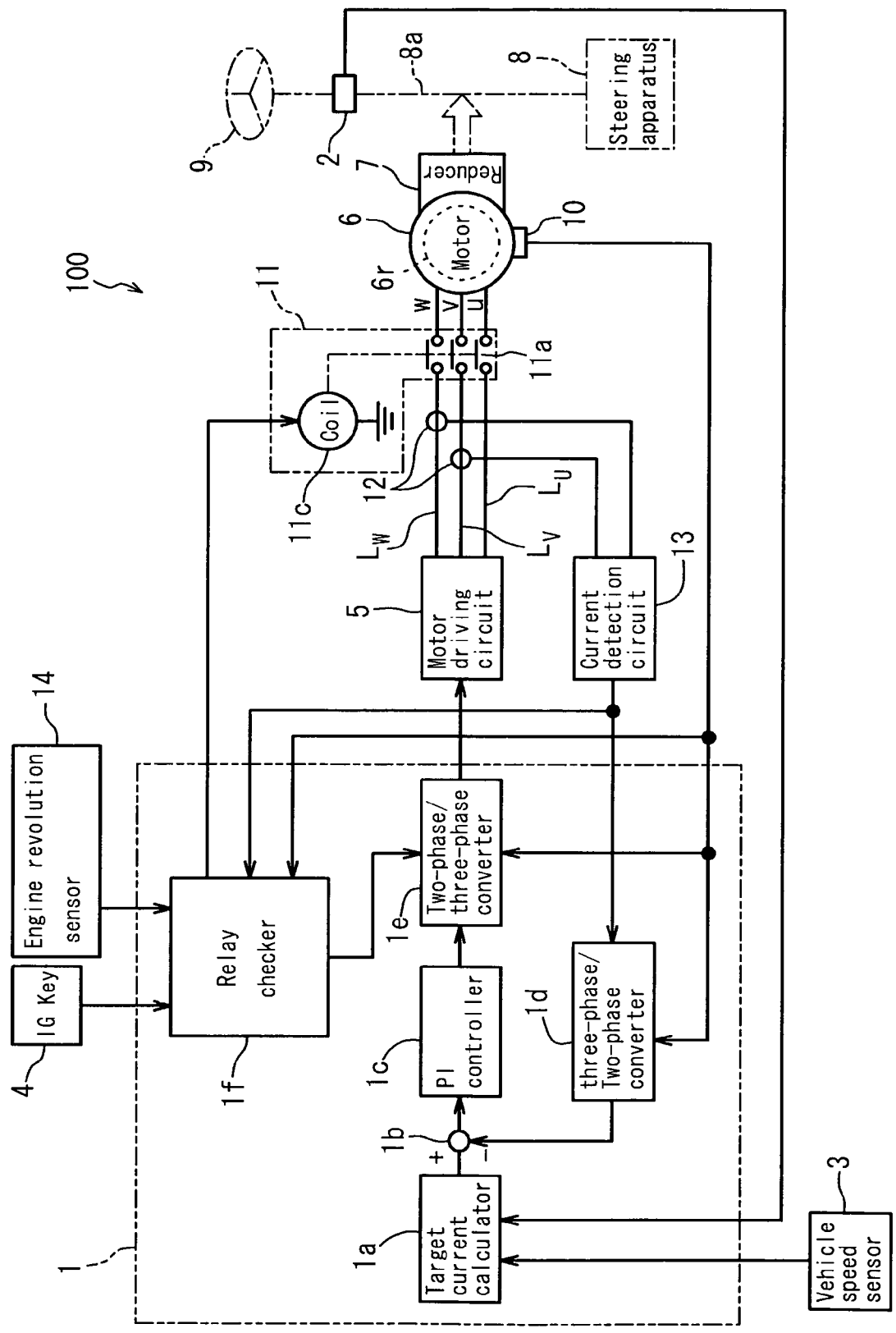
FIG. 6 is a block diagram illustrating the circuit configuration of the electric power steering apparatus according to the second and third embodiments of the present invention.

FIG. 6 is a block diagram illustrating the circuit configuration of the electric power steering apparatus 100 according to the second embodiment of the present invention. FIG. 6 has the same circuit configuration as that shown in FIG. 1 except for that the contacts 11a of the relay 11 are inserted to all of the current paths $L_U$, $L_V$, and $L_W$ of the three phases (U, V, and W).

In the case of the conduction check based on the conditions as used in the first embodiment according to which "the current of one phase is 0 and the currents of the other two phases have an identical absolute value and different signs", only two contacts can be simultaneously subjected to the conduction check at maximum. Specifically, when three contacts should be subjected to the conduction check, the conduction check process must be performed in a stepwise manner based on two stages.

Figure 7A:
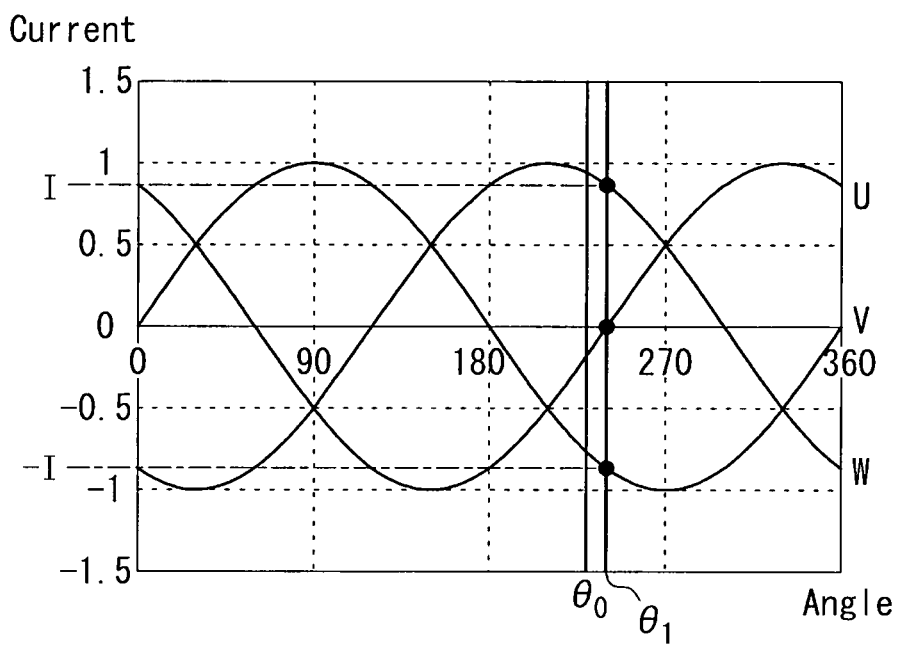
FIG. 7A and FIG. 7B illustrate driving current waveforms (i.e., field current waveforms) of three phases (U, V, and W) of a motor in which the horizontal axis shows an electric angle and the vertical axis shows a current amplitude ratio and illustrate a basic concept of a conduction check process in the electric power steering apparatus according to the second embodiment.
Figure 7B:
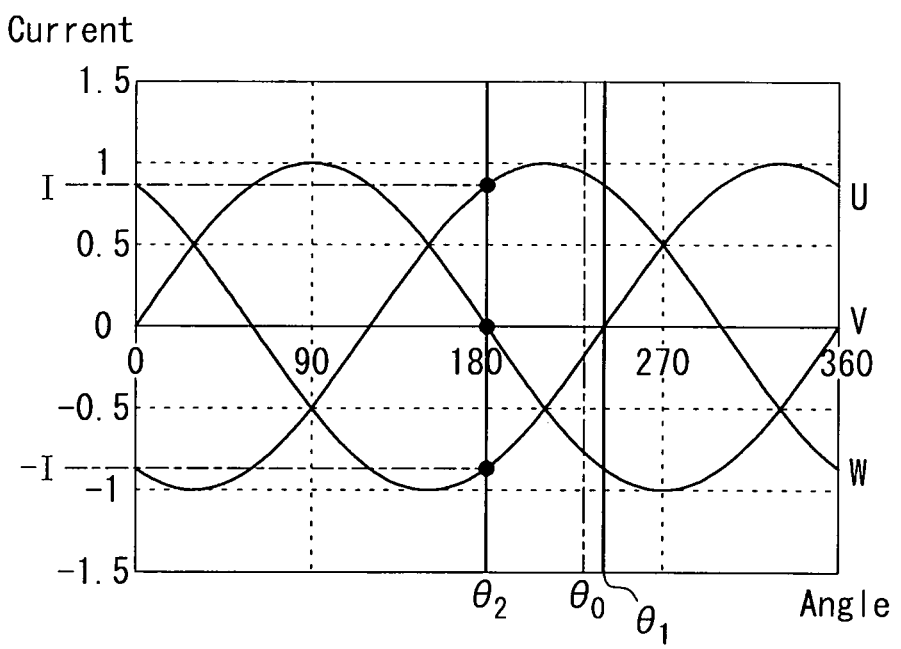

FIG. 7A and FIG. 7B illustrate driving current waveforms (i.e., field current waveforms) of the three phases (U, V, and W) of the motor 6 in which the horizontal axis shows an electric angle and the vertical axis shows a current amplitude ratio and illustrates the driving current waveforms of the three phases (U, V, and W) of the motor 6 (i.e., field current waveforms (ideal waveforms)). When assuming that the rotor 6r is positioned at the electric angle $\theta_0$ in FIG. 7A, the nearest electric angle among electric angles (hereinafter called a 0 (zero) point) at which the current value of one phase of the three phases of U, V, and W is 0 is the electric angle $\theta_1$ at which the phase U has the current value of 0. Thus, the energization angle $\theta_1$ at which the phase U has the current value of 0 is set as a target electric angle in the first stage of the conduction check process. At the energization angle $\theta_1$, no current flows in the current path $L_U$ of the phase U among the current paths of the three phases and currents that have an identical absolute value and that have different signs flow in the current paths $L_V$ and $L_W$ of the other two phases (V and W).

Next, when the rotor 6r rotated from the electric angle $\theta_0$ is positioned at the electric angle $\theta_1$ in FIG. 7B, another nearest zero point is the electric angle $\theta_2$ at which the phase V has the current value of 0 for example. Thus, the energization angle $\theta_2$ at which the phase V has the current value of 0 is set as a target electric angle in the second stage of the conduction check process. At the energization angle $\theta_2$, no current flows in the current path $L_V$ of the phase V among the current paths of the three phases and currents that have an identical absolute value and that have different signs flow in the current paths $L_U$ and $L_W$ of the other two phases (U and W).

Figure 8:
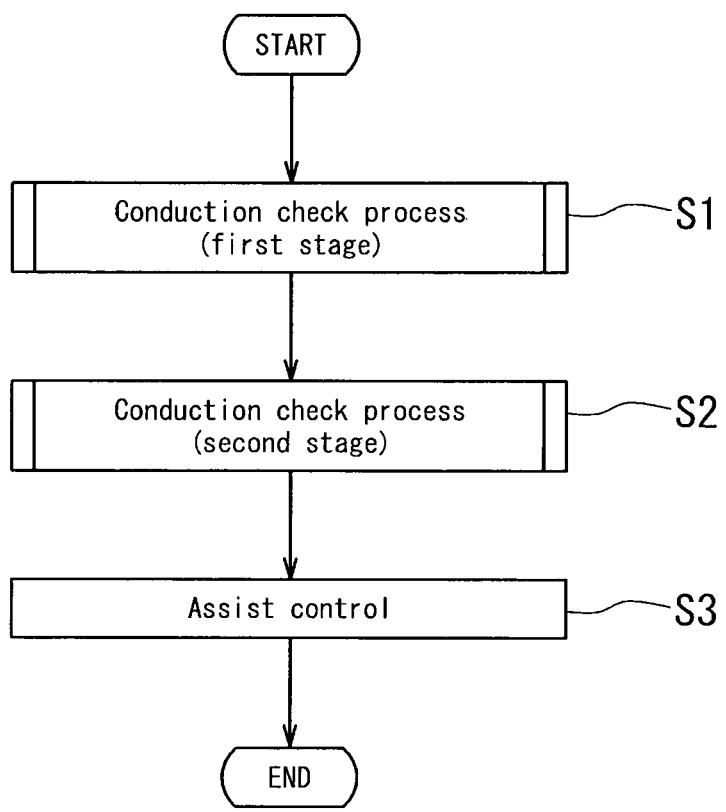
FIG. 8 is a flowchart illustrating the conduction check process of the electric power steering apparatus according to the second and third embodiments.
Figure 9:
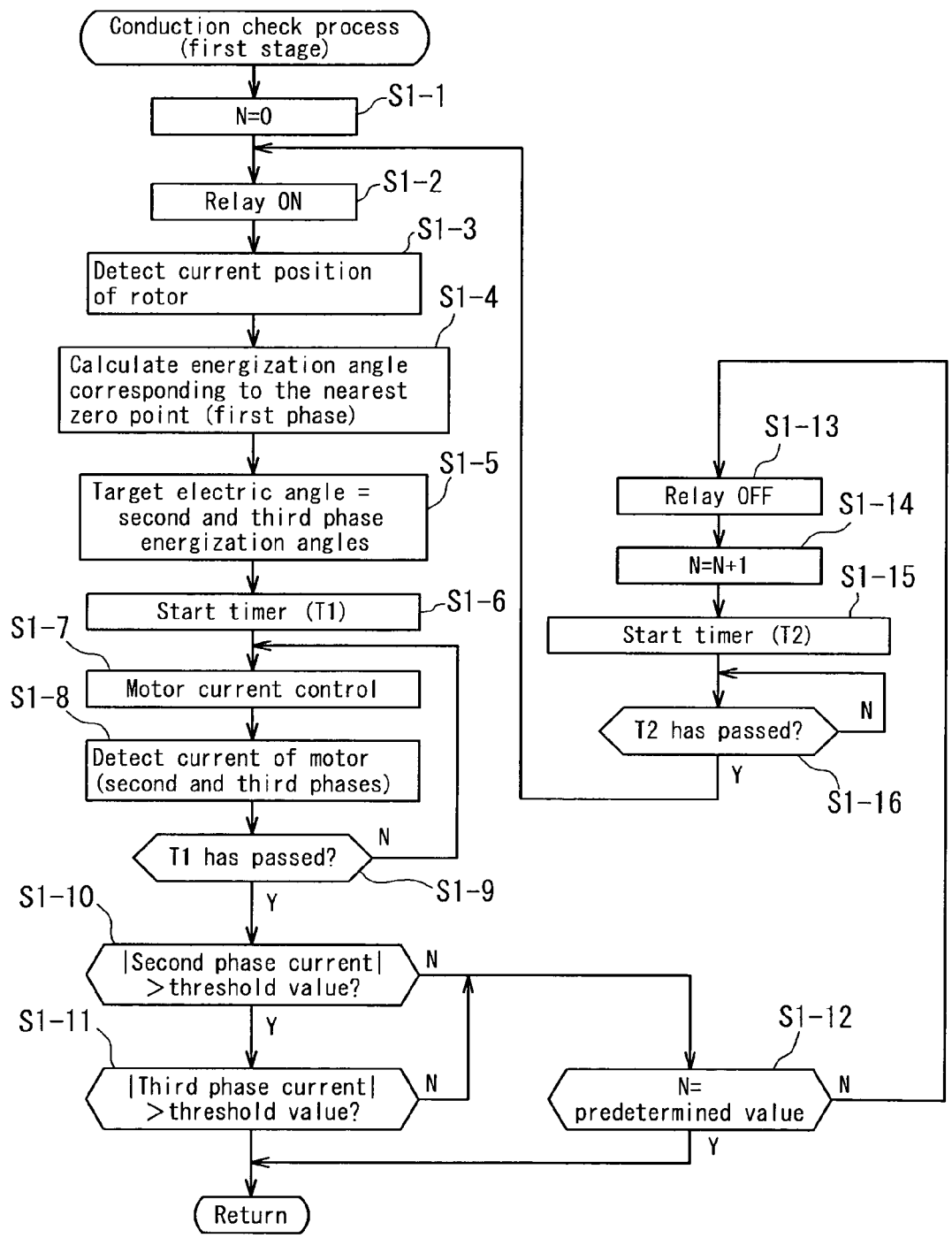
FIG. 9 is a flowchart illustrating the conduction check process at the first stage in the second embodiment.
Figure 10:
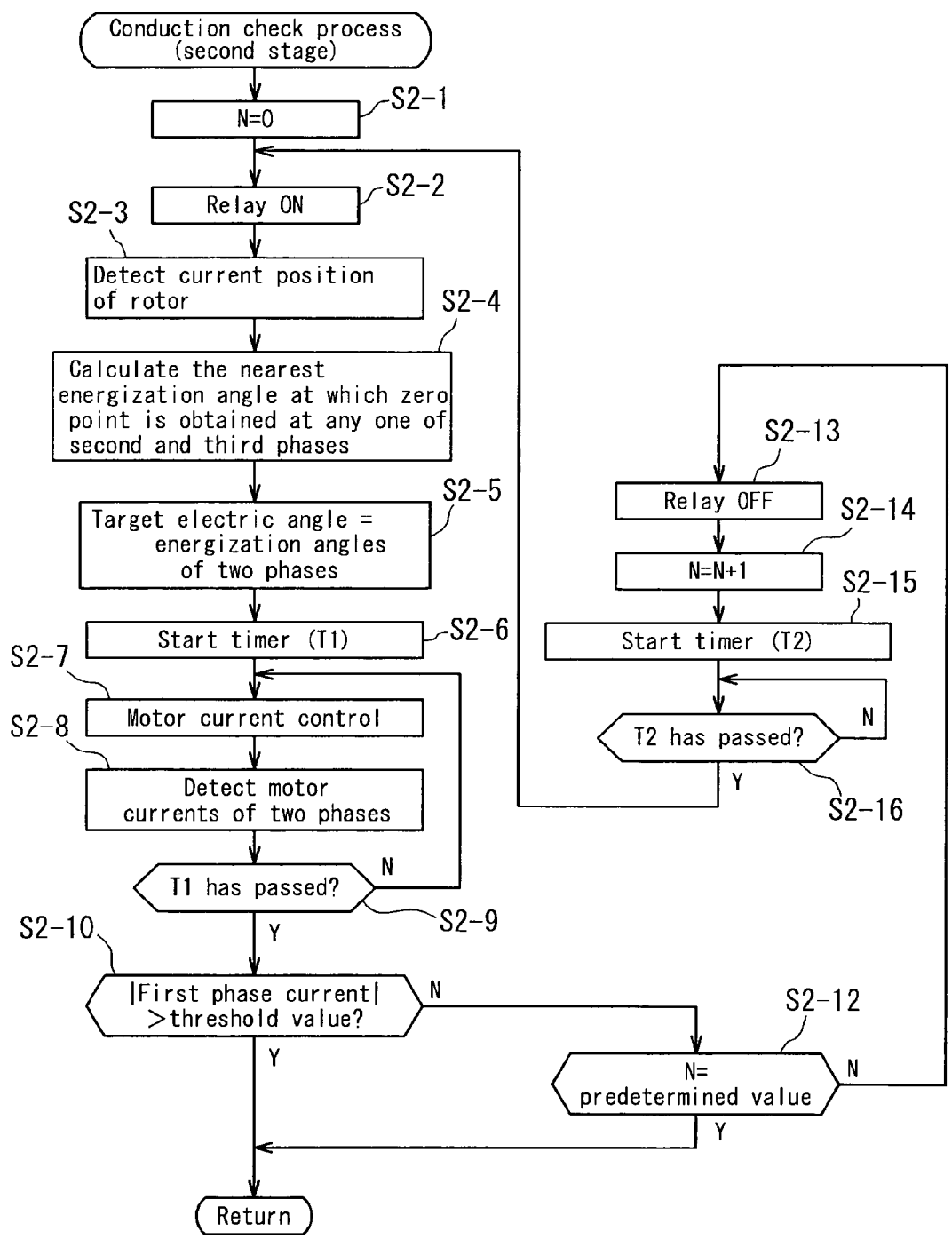
FIG. 10 is a flowchart illustrating the conduction check process at the second stage in the second embodiment.

FIG. 8, FIG. 9 and FIG. 10 are flowcharts illustrating the normal control operation prior to the assist control. In FIG. 8, after the start of the processing, the controller 1 firstly performs the conduction check process of the first stage (Step S1) to subsequently perform the conduction check process of the second stage (Step S2) to subsequently starts the normal assist control (Step S3).

The conduction check process of the first stage is performed based on the flowchart shown in FIG. 9. In FIG. 9 (see also FIG. 6), the controller 1 (mainly the function of the relay checker 1f) sets the initial value of the count value N to 0 (Step S1-1). Next, the controller 1 excites the relay 11 to close the contacts 11a (Step S1-2). Next, the controller 1 detects the current position of the rotor 6r based on the output from the rotation angle sensor 10 (Step S1-3).

In Step S1-4, the controller 1 calculates an energization angle corresponding to the nearest zero point to the current position (electric angle) of the rotor 6r (a phase at which the current value is 0 is assumed as the first phase). Specifically, in the example of FIG. 7A, the nearest zero point to the current position $\theta_0$ of the rotor 6r is an energization angle at which the phase U has the current value of 0. Thus, the energization angle $\theta_1$ is calculated so that currents that have an identical absolute value and that have different signs are energized for the other phases V and W (Step S1-4) to set the energization angle $\theta_1$ as a target electric angle (Step S1-5).

Then, the controller 1 starts the internal timer (set time T1) (Step S1-6) to control the motor current (Step S1-7). This control is performed by allowing the relay checker 1f to instruct the two-phase/three-phase converter 1e to control the motor driving circuit 5 so that the current of 0[A] flows at the phase U, the current of −I[A] flows at the phase V, and the current of I[A] flows at the phase W, respectively. The currents actually flowing in the current paths $L_V$ and $L_W$ of the phases V and W are detected based on the output from the current detection circuit 13 (Step S1-8). By the flow of current as described above, the rotor 6r is rotated to the position at the electric angle $\theta_1$ (FIG. 7A).

The above I[A] is on the order of a few amperes for example. By flowing of such high current, the conduction check can be performed securely. Even when the surface of the contact 11a has thereon metal foreign matters or an oxide layer, the metal foreign matters or oxide layer can be fused or can be thermally destroyed and can be removed. This energization of current is continuously performed until the set time T1 is passed (Step S1-9). When the set time T1 has passed since the start of the flow of the current, the controller 1 determines, with regard to the second phase (the phase V) and the third phase (the phase W) respectively, whether the absolute values of the currents exceed the threshold value or not (Steps S1-10 and S1-11). When both of the absolute values of the currents exceed the threshold value, the controller 1 determines that each contact 11a has a favorable conduction to subsequently perform the conduction check process of the second stage (Step S2 of FIG. 8). The above threshold value may be set to be lower than the absolute values of the currents I and −I in consideration of a factor that how much the absolute value of the current I flowing at the phases V and W is reduced when any one of the contacts 11a has an increased contact resistance and has an abnormal value.

When any one of the currents for the phase V and the phase W is equal to or lower than the threshold value on the other hand, whether N reaches a predetermined value or not is determined (Step S1-12). The value N means the number of execution of the conduction check process (and a foreign matter removal processing) by closing the contacts 11a to pass high current. The value N is set to an integer of 2 or more. When the value N in Step S1-12 does not reach the predetermined value, the controller 1 once returns the relay 11 to a not-excited status (Step S1-13) and increases the value N by one (Step S1-14) to start the internal timer (set time T2) (Step S1-15) to wait when the time T2 is passed (Step S1-16). Specifically, the time T2 is a waiting time for waiting when the relay 11 is not excited and the contacts 11a are securely opened. When this waiting time T2 has passed, the controller 1 returns to Step S1-2 to excite the relay 11 again. Thereafter, the same processing is repeated until the value N reaches the predetermined value.

When the repetition of the conduction check process results in the currents of the phase V and the phase W having an absolute value exceeding the threshold value, the controller 1 starts the assist control (Step S2 of FIG. 8). When the value N reaches the predetermined value while the currents of the phase V and the phase W still having an absolute value equal to or lower than the threshold value on the other hand, the controller 1 also performs the conduction check process of the second stage. In this case, the determination of "YES" in Step S1-12 also may be followed by a step of providing an alarm display showing that the contact 11a has a defective electrical conductivity.

The conduction check process of the second stage is performed based on the flowchart shown in FIG. 10. In FIG. 10 (see also FIG. 6), the controller 1 (mainly the function of the relay checker 1f) sets the initial value of the count value N to 0 (Step S2-1). Next, the controller 1 excites the relay 11 (or continues the excitation when the relay 11 is already excited) to close the contacts 11a (Step S2-2). Next, the controller 1 detects the current position of the rotor 6r based on the output from the rotation angle sensor 10 (Step S2-3).

In Step S2-4, the controller 1 calculates the energization angle at the nearest zero point to the current position of the rotor 6r at which any one of the second phase and the third phase has a current value of 0. Specifically, in the example of FIG. 7B, an energization angle at the nearest zero point to the current position $\theta_1$ of the rotor 6r at which phases other than the phase U have a current value of 0 is an energization angle at which the phase V has a current value of 0 for example. Thus, the energization angle $\theta_2$ is calculated so that currents that have an identical absolute value and that have different signs are energized at the phase U and the phase W other than the phase V (Step S2-4) to set the energization angle $\theta_2$ as a target electric angle (Step S2-5). The wording "the energization angle $\theta_2$ is calculated" specifically means the following.

Specifically, at the current position $\theta_1$ of the rotor 6r (electric angle) when the conduction check process of the first stage is performed, the phase U has a current value of 0. Thus, at the rotor position plus or minus 60 degrees from the angle $\theta_1$, the phase V or the phase W has a current value of 0. Thus, the rotor position at ($\theta_1$+60 degrees) or ($\theta_1$−60 degrees) can be assumed as a target electric angle.

Then, the controller 1 starts the internal timer (set time T1) (Step S2-6) to control the motor current (Step S2-7). This control is performed by allowing the relay checker 1f to instruct the two-phase/three-phase converter 1e to control the motor driving circuit 5 so that the current of −I[A] flows at the phase U, the current of 0[A] flows at the phase V, and the current of I[A] flows at the phase W. The currents actually flowing in the current paths $L_U$ and $L_W$ at the phases U and W are detected by the output from the current detection circuit 13 (Step S2-8). By the flow of current as described above, the rotor 6r is rotated to the position at the electric angle $\theta_2$ (FIG. 7B). This rotation angle is 60 degrees.

The above I[A] is on the order of a few amperes for example. By flowing of such high current, even metal foreign matters or an oxide layer on the surface of the contact 11a can be fused or thermally destroyed and can be removed. This energization of current is continuously performed until the set time T1 is passed (Step S2-9). When the set time T1 has passed since the start of the flow of the current, the controller 1 determines, with regard to the first phase (the phase U), whether the absolute value of the current exceeds a threshold value or not (Step S2-10). When the absolute value of the current exceeds the threshold value, the controller 1 assumes that the contact 11a has a favorable conduction to complete the processing to subsequently start the normal assist control (Step S3 of FIG. 8). The above threshold value can be set to be lower than the absolute value of the current −I in consideration of a factor that how much the absolute value of the current − flowing at the phase U is reduced when any one of the contacts 11a has an increased contact resistance and has an abnormal value.

When the current of the phase U is equal to or lower than the threshold value on the other hand, whether the value N reaches the predetermined value or not is judged (Step S2-12). This value N means the number of execution of the conduction check process (and a foreign matter removal processing) by closing the contacts 11a to pass high current. The value N is set to an integer of 2 or more. When the value N does not reach the predetermined value in Step S2-12, the controller 1 once returns the relay 11 to a not-excited status (Step S2-13) and increases the value N by one (Step S2-14) to start the internal timer (set time T2) (Step S2-15) to wait when the time T2 is passed (Step S2-16). Specifically, the time T2 is a waiting time for waiting when the relay 11 is not excited and the contacts 11a are securely opened. When this waiting time T2 has passed, the controller 1 returns to Step S2-2 to excite the relay 11 again. Thereafter, the same processing is repeated until the value N reaches the predetermined value.

When the repetition of the conduction check process results in the current of the phase U having an absolute value exceeding the threshold value, the controller 1 starts the assist control (Step S3 of FIG. 8). When the value N reaches the predetermined value while the current of the phase U still having an absolute value equal to or lower than the threshold value on the other hand, the controller 1 also starts the assist control. The determination of "YES" in Step S2-12 of FIG. 10 also may be followed by a step of providing an alarm display showing that the contact 11a has a defective electrical conductivity.

When the electrical conductivities of the three contacts 11a are all normal, the absolute values of the currents of the respective phases U, V, and W exceed the threshold value after one energization. Thus, one energization is performed for the phase U in the second stage, one energization is performed for the phase V in the first stage, and the total of two energizations are performed for the phase W in the first and second stages.

As described above, in the electric power steering apparatus according to the second embodiment, no current flows in the current path of any one phase and currents that have an identical absolute value and that have different signs flow in the current paths of the other two phases. Thus, the status at one energization angle on the driving current waveform of the motor 6 can be given continuously and relatively-high current can simultaneously flow in the contacts 11a inserted to the two phases. At the same time, no current also can flow in another phase to perform the same processing to flow current in a contact of the phase at which no current was firstly flowed. Through the processing based on the two stages, the electrical conductivities of all of the contacts inserted to the current paths of the three phases can be investigated.

By flowing of such high current in the respective contacts $11a$, the conduction check can be performed securely. The flow of such high current also can fuse metal foreign matters or can thermally destroy an oxide layer. Specifically, an improved function can be provided to remove foreign matters on the surface of the contact to recover a favorable electrical conductivity.

Furthermore, the rotation angle of the rotor $6r$ can be suppressed to a smaller value because the conduction check process can be performed without being limited by a specific phase and while three phases being energized at an energization angle that is nearest to the current position of the rotor $6r$ and at which one phase has a current value of 0. Since the zero point exists at every 60 degrees of an electric angle, the rotation angle of the rotor $6r$ also can be within the electric angle of 60 degrees.

Third Embodiment

The electric power steering apparatus 100 according to the third embodiment of the present invention has the same circuit configuration as that of the second embodiment. Thus, the electric power steering apparatus 100 according to the third embodiment has the circuit configuration as shown in the block diagram of FIG. 6.

In the third embodiment, three contacts should be subjected to the conduction check as in the second embodiment. Thus, the conduction check process must be performed based on two stages. In the third embodiment, an order of phases for which no current flows during the conduction check process is determined. For example, the order is the phase W, the phase V, and the phase U. The controller 1 sequentially memorizes this order and the phase for which no current flowed in the previous processing. The controller 1 memorizes this order and the phase for which no current flowed in the previous processing even when the ignition key 4 (FIG. 6) is turned OFF. Thus, when the ignition key 4 is turned ON and the engine is started thereafter, the next phase in this order will be "a phase for which no current flows".

Figure 11A:
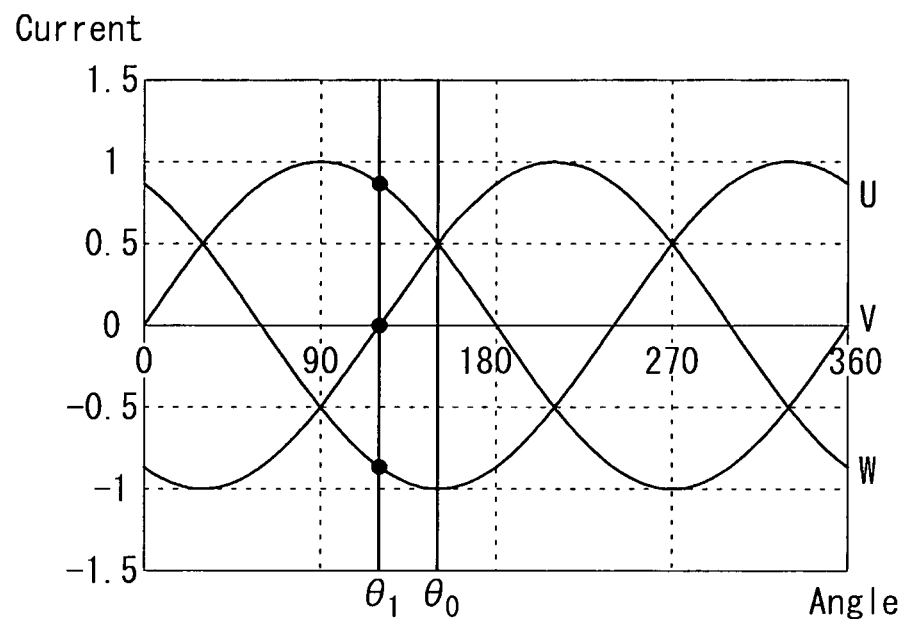
FIG. 11A and FIG. 11B illustrate driving current waveforms (i.e., field current waveforms) of three phases (U, V, and W) of a motor in which the horizontal axis shows an electric angle and the vertical axis shows a current amplitude ratio and illustrate a basic concept of a conduction check process in the electric power steering apparatus according to the third embodiment.
Figure 11B:
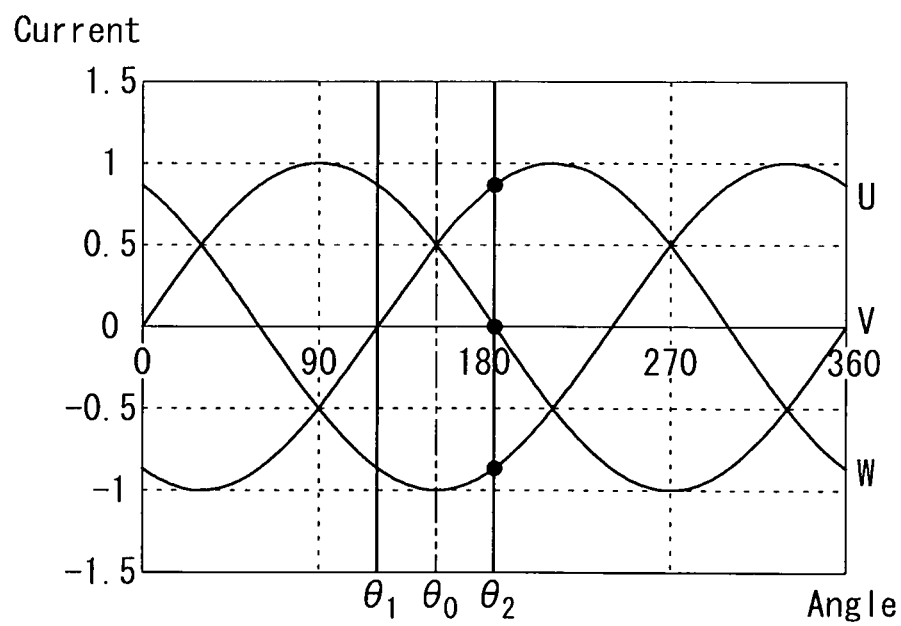

FIG. 11A and FIG. 11B illustrate driving current waveforms (i.e., field current waveforms) of three phases (U, V, and W) of the motor 6 in which the horizontal axis shows an electric angle (energization angle) and the vertical axis shows a current amplitude ratio. When assuming that the rotor $6r$ is positioned at the electric angle $\theta_0$ in FIG. 11A, the nearest electric angle at the zero point at which the phase W has a current value of 0 is $\theta_1$. Thus, the energization angle $\theta_1$ at which the phase W has a current value of 0 is set as a target electric angle in the first stage of the conduction check process. At the energization angle $\theta_1$, no current flows in the current path $L_W$ of the phase W among the current paths of the three phases and currents that have an identical absolute value and that have different signs flow in the current paths $L_U$ and $L_V$ of the other two phases (U and V).

Next, when the rotor $6r$ rotated from the electric angle $\theta_0$ is positioned at the electric angle $\theta_1$ in FIG. 7B, the energization angle at the nearest zero point at which the phase V has a current value of 0 is $\theta_2$ (i.e., $\theta_1$–60 degrees). Thus, the energization angle $\theta_2$ at which the phase V has a current value of 0 is set as a target electric angle in the second stage of the conduction check process. At the energization angle $\theta_2$, no current flows in the current path $L_V$ of the phase V among the current paths of the three phases and currents that have an identical absolute value and that have different signs flow in the current paths $L_U$ and $L_W$ of the other two phases (U and W).

Figure 12:
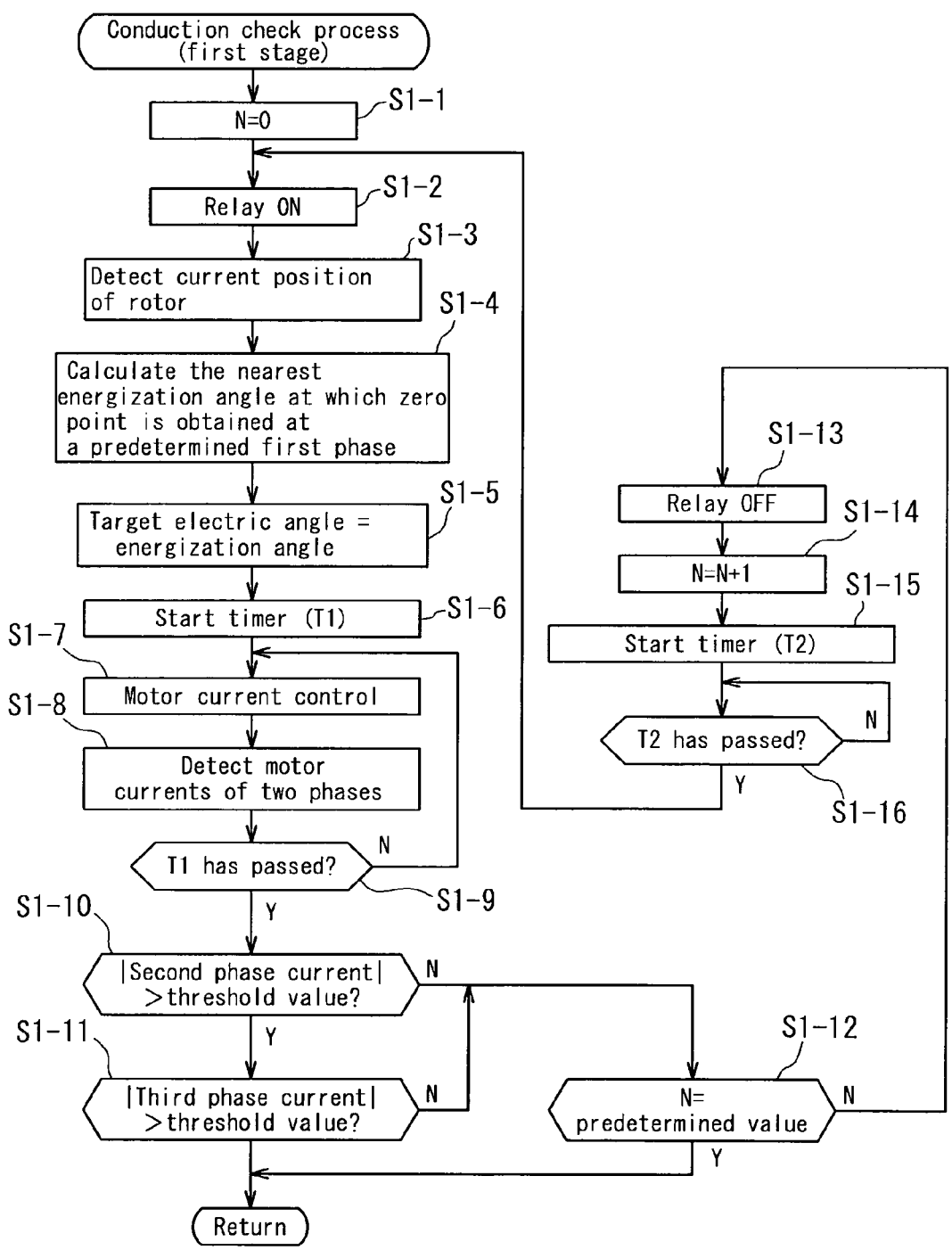
FIG. 12 is a flowchart illustrating the conduction check process in the first stage in the third embodiment.
Figure 13:
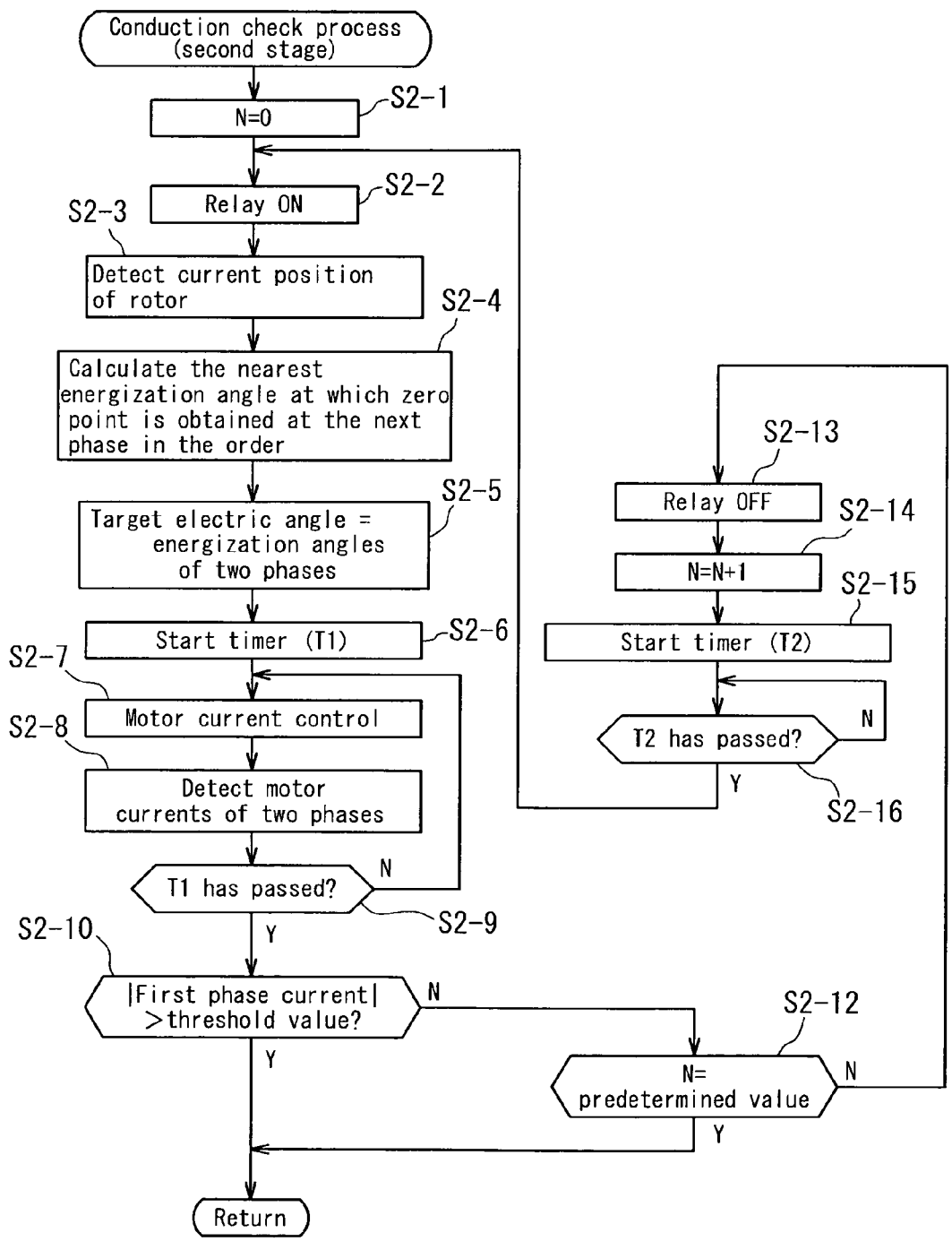
FIG. 13 is a flowchart illustrating the conduction check process in the second stage in the third embodiment.

FIG. 8, FIG. 12, and FIG. 13 are flowcharts illustrating the normal control operation prior to the assist control. The control operation in FIG. 8 is as described in the second embodiment.

The conduction check process of the first stage is performed based on the flowchart shown in FIG. 12. In FIG. 12 (see also FIG. 6), the controller 1 (mainly the function of the relay checker $1f$) sets the initial value of the count value N to 0 (Step S1-1). Next, the controller 1 excites the relay 11 to close the contacts $11a$ (Step S1-2). Next, based on the output from the rotation angle sensor 10, the controller 1 detects the current position of the rotor $6r$ (Step S1-3).

In Step S1-4, the controller 1 calculates the energization angle at the nearest zero point at which the predetermined first phase in the order (the phase W in this case) has a current value of 0. Specifically, in the example of FIG. 11A, the nearest zero point to the current position $\theta_0$ of the rotor $6r$ is at the energization angle $\theta_1$. Thus, the controller 1 calculates the energization angle $\theta_1$ (Step S1-4) to set the energization angle $\theta_1$ as a target electric angle (Step S1-5). At this energization angle $\theta_1$, currents that have an identical absolute value and that have different signs can be energized at the phases U and V.

Then, the controller 1 starts the internal timer (set time T1) (Step S1-6) to control the motor current (Step S1-7). This control is performed by allowing the relay checker $1f$ to instruct the two-phase/three-phase converter $1e$ to control the motor driving circuit 5 so that the current of –I[A] flows at the phase U, the current of I[A] flows at the phase V, and the current of 0[A] flows at the phase W, respectively. The currents actually flowing in the current paths $L_U$ and $L_V$ of the phases U and V are detected by the output from the current detection circuit 13 (Step S1-8). By the flow of current as described above, the rotor $6r$ is rotated to the position at the electric angle $\theta_1$ (FIG. 11A).

The above current I[A] is on the order of a few amperes for example. By flowing of such high current, the conduction check can be performed securely. Even when the surface of the contact $11a$ has thereon metal foreign matters or an oxide layer, the metal foreign matters or oxide layer can be fused or can be thermally destroyed and can be removed. This energization of current is continuously performed until the set time T1 is passed (Step S1-9). When the set time T1 has passed since the start of the flow of the current, the controller 1 determines, with regard to the second phase (the phase U) and the third phase (the phase V) respectively, whether the absolute values of the currents exceed the threshold value or not (Steps S1-10 and S1-11). When the absolute values of the currents both exceed the threshold value, the controller 1 determines that each contact $11a$ has a favorable conduction to complete the processing to subsequently start the conduction check process of the second stage (Step S2 of FIG. 8). The above threshold value may be set to be lower than the absolute values of the currents I and –I in consideration of a factor that how much the absolute value of the current I flowing at the phases U and V is reduced when any one of the contacts $11a$ has an increased contact resistance and has an abnormal value.

When any one of the currents for the second phase (the phase U) and the third phase (the phase V) is equal to or lower than the threshold value on the other hand, whether N reaches a predetermined value or not is determined (Step S1-12). The value N means the number of execution of the conduction check process (and a foreign matter removal processing) by closing the contacts 11a to pass high current. The value N is set to an integer of 2 or more. When the value N does not reach the predetermined value in Step S1-12, the controller 1 once returns the relay 11 to a not-excited status (Step S1-13) and increases the value N by one (Step S1-14) to start the internal timer (set time T2) (Step S1-15) to wait when the time T2 is passed (Step S1-16). Specifically, the time T2 is a waiting time for waiting when the relay 11 is not excited and the contacts 11a are securely opened. When this waiting time T2 has passed, the controller 1 returns to Step S1-2 to excite the relay 11 again. Thereafter, the same processing is repeated until the value N reaches the predetermined value.

When the repetition of the conduction check process results in the currents of the second phase (the phase U) and the third phase (the phase V) having an absolute value exceeding the threshold value, the controller 1 performs the conduction check process of the second stage (Step S2 of FIG. 8). When the value N reaches the predetermined value while any one of the currents of the two phases still having an absolute value equal to or lower than the threshold value on the other hand, the controller 1 also performs the conduction check process of the second stage. In this case, the determination of "YES" in Step S1-12 also may be followed by a step of providing an alarm display showing that the contact 11a has a defective electrical conductivity.

The conduction check process of the second stage is performed based on the flowchart shown in FIG. 13. In FIG. 13 (see also FIG. 6), the controller 1 (mainly the function of the relay checker 1f) sets the initial value of the count value N to 0 (Step S2-1). Next, the controller 1 excites the relay 11 (or continues the excitation when the relay 11 is already excited) to close the contacts 11a (Step S2-2). Next, based on the output from the rotation angle sensor 10, the controller 1 detects the current position of the rotor 6r (Step S2-3).

In Step S2-4, the controller 1 calculates the nearest energization angle at which the phase V has a current value of 0 and which is at the next phase in the order when seen from the current position of the rotor 6r. Specifically, in the example of FIG. 11B, the nearest energization angle to the current position of the rotor 6r $\theta_1$ at which the phase V has a current value of 0 is found to calculate the energization angle $\theta_2$ (Step S2-4) to set the energization angle $\theta_2$ as a target electric angle (Step S2-5). At this energization angle $\theta_2$, currents that have an identical absolute value and that have different signs can be energized at the phases U and W.

Then, the controller 1 starts the internal timer (set time T1) (Step S2-6) to control the motor current (Step S2-7). This control is performed by allowing the relay checker 1f to instruct the two-phase/three-phase converter 1e to control the motor driving circuit 5 so that the current of –[A] flows at the phase U, the current of 0[A] flows at the phase V, and the current of I[A] flows at the phase W, respectively. The currents actually flowing in the current paths $L_U$ and $L_W$ of the phases U and W are detected based on the output from the current detection circuit 13 (Step S2-8). By the flow of such current, the rotor 6r is rotated to the position at the electric angle $\theta_2$ (FIG. 11B). This rotation angle is 60 degrees.

The above I[A] is on the order of a few amperes for example. The flow of such high current can provide a secure conduction check. Even metal foreign matters or an oxide layer on the surface of the contact 11a can be fused or thermally destroyed and can be removed. This current energization is continuously performed until the set time T1 is passed (Step S2-9). When the set time T1 has passed since the start of the flow of the current, the controller 1 determines, with regard to the first phase (the phase W), whether the absolute value of the current exceeds the threshold value or not (Step S2-10). When the absolute value of the current exceeds the threshold value, the controller 1 assumes that the contact 11a has a favorable conduction to complete the processing to subsequently start the normal assist control (Step S3 of FIG. 8). The above threshold value can be set to be lower than the absolute value of the current I in consideration of a factor that how much the absolute value of the current I flowing at the first phase (the phase W) is reduced when any one of the contacts 11a has an increased contact resistance and has an abnormal value.

When the current of the first phase (the phase W) is equal to or lower than the threshold value on the other hand, whether the value N reaches the predetermined value or not is judged (Step S2-12). The value N means the number of execution of the conduction check process (and a foreign matter removal processing) by closing the contacts 11a to pass high current. The value N is set to an integer of 2 or more. When the value N does not reach the predetermined value in Step S2-12, the controller 1 once returns the relay 11 to a not-excited status (Step S2-13) to increase the value N by one (Step S2-14) to start the internal timer (set time T2) (Step S2-15) to wait when the time T2 is passed (Step S2-16). Specifically, the time T2 is a waiting time for waiting when the relay 11 is not excited and the contacts 11a are securely opened. When this waiting time T2 has passed, the controller 1 returns to Step S2-2 to excite the relay 11 again. Thereafter, the same processing is repeated until the value N reaches the predetermined value.

When the repetition of the conduction check process results in the current of the first phase (the phase W) having an absolute value exceeding the threshold value, the controller 1 starts the assist control (Step S3 of FIG. 8). When the value N reaches the predetermined value while the current of the first phase (the phase W) still having an absolute value equal to or lower than the threshold value on the other hand, the controller 1 also starts the assist control. The determination of "YES" in Step S2-12 of FIG. 13 also may be followed by a step of providing an alarm display showing that the contact 11a has a defective electrical conductivity.

When the electrical conductivities of the three contacts 11a are all normal, the absolute values of the currents of the respective phases U, V, and W exceed the threshold value after one energization. Thus, the total of two energizations are performed for the phase U in the first and second stages, one energization is performed for the phase V in the first stage, and one energization is performed for the phase W in the second stage.

As described above, in the electric power steering apparatus according to the third embodiment, no current flows in the current path of one phase and currents that have an identical absolute value and that have different signs flow in the current paths of the other two phases. Thus, the status at one energization angle on the driving current waveform of the motor 6 can be given continuously and relatively-high currents can simultaneously flow in the contacts 11a inserted to the two phases. At the same time, no current also can flow in another phase to perform the same processing to pass current in a contact of the phase at which no current firstly flowed. Through the processing based on the two stages, the electrical conductivities of all of the contacts inserted to the current paths of the three phases can be investigated.

By flowing of such high current in the respective contacts 11a, the conduction check can be performed securely. The flow of such high current also can fuse metal foreign matters or can thermally destroy an oxide layer. Specifically, an improved function can be provided to remove foreign matters on the surface of the contact to recover a favorable electrical conductivity.

Even when phases for which no current flows are selected based on a previously-determined order, all of the zero points of the three phases exist within a range of the electric angle of 180 degrees. Thus, the rotor 6r is rotated with the electric angle of 90 degrees at maximum. Thus, the rotation angle of the rotor 6r can be within the range of the electric angle of 90 degrees.

Another Example of Third Embodiment

Figure 14:
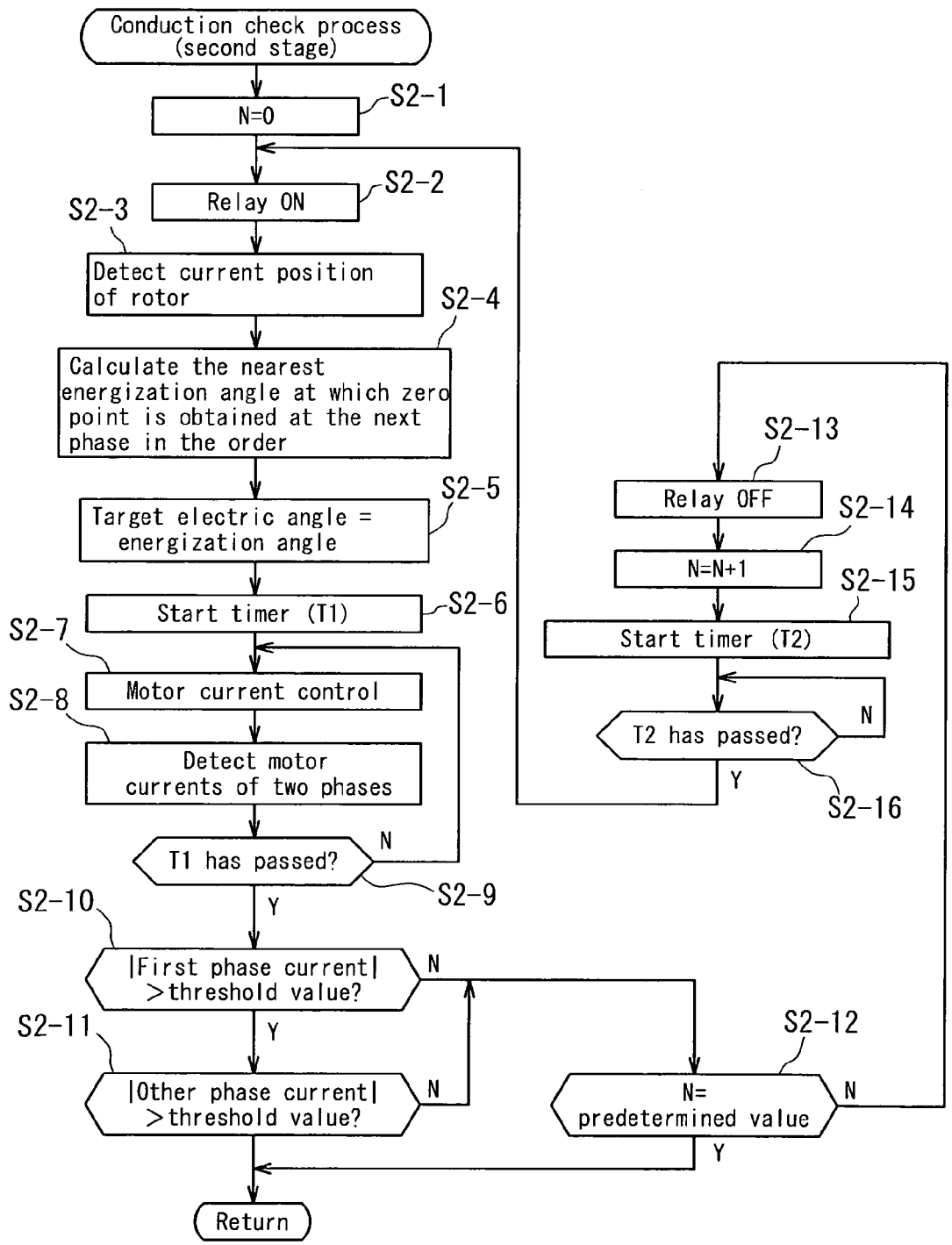
FIG. 14 is a flowchart illustrating another example of the conduction check process in the second stage in the third embodiment.

Although the third embodiment has made the comparison with the threshold value in the second stage only with regard to the phase for which no current flowed in the conduction check process of the first stage, the second stage also may carry out the comparison with the threshold value with regard to the two phases for which current flowed. FIG. 14 is a flowchart illustrating another conduction check process in the second stage. FIG. 14 is different from FIG. 13 in that Step S2-11 is provided to carry out the comparison with the threshold value in the second stage also with regard to the phase for which the comparison with the threshold value was carried out in the first stage.

When the flowchart of FIG. 14 is applied to the conduction check process of the second stage instead of the flowchart of FIG. 13, the conduction check process performed whenever the ignition key 4 is changed from OFF to ON is performed as shown in Table 1 shown below for example.

TABLE 1

| From OFF to ON of IG key 4 | | Conduction check (○: done, x: not done) | | |
|---|---|---|---|---|
| | | Phase U | Phase V | Phase W |
| First | First stage | ○ | ○ | x |
| | Second stage | ○ | x | ○ |
| Second | First stage | x | ○ | ○ |
| | Second stage | ○ | ○ | x |
| Third | First stage | ○ | x | ○ |
| | Second stage | x | ○ | ○ |
| Numbers of accumulated checks | | 4 | 4 | 4 |

As shown in Table 1, when the operation from OFF to ON of the ignition key 4 (including the engine start) is performed three times, the numbers of accumulated conduction checks of the respective phases are equal. Thereafter, the numbers of the accumulated conduction checks of the respective phases are equal whenever the operation from OFF to ON of the ignition key 4 is performed a three-multiple times. Thus, the promotion of the deterioration of the contacts 11a due to the conduction check process can be uniform. This can prevent a case where only a contact of a specific phase is deteriorated soon. This consequently contributes to the longer life of the contacts 11a.

As in the first embodiment, the second and third embodiments also can select the reduction ratio so that (motor pole number)×(reduction ratio) is 90 degrees or more to limit, even when the rotor 6r is rotated at the electric angle of 90 degrees at maximum, the rotation of the steering wheel 9 to 2 degrees or less. The rotation of the steering wheel 9 limited to 2 degrees or less can prevent the driver from noticing the rotation. Specifically, even when the steering wheel 9 is slightly rotated due to the conduction check process for the contacts 11a, the driver can be prevented from noticing the rotation to feel uncomfortable.

Although the respective embodiments have shown one relay 11 including a plurality of contacts 11a, two or three relays including respective contacts may be inserted so that the controller 1 can individually control the respective relays (the respective contacts).

What is claimed is:

1. An electric power steering apparatus using a three-phase brushless motor to generate a steering assist force, comprising:
    a motor driving circuit for supplying electric power to the three-phase brushless motor;
    a relay that can open or close contacts interposed between the motor and the motor driving circuit and respectively inserted to at least current paths of two phases among current paths of three phases for supplying electric power from the motor driving circuit to the three-phase brushless motor;
    a current detector for detecting respective phase currents flowing in the current paths having the contact inserted; and
    a controller for controlling the relay and the motor driving circuit, the controller starting a conduction check process for the closed contacts, prior to an assist control by the motor, to make a continuous condition that no current flows in the current path of one of three phases whereas currents on driving current waveform for the motor having an identical absolute value with positive and negative signs different from each other flow in the current paths of the other two phases at one energization angle on the driving current waveform, the controller performing a conduction check process under the aforementioned condition by the current detector actually detecting current flowing in at least one phase of current paths having the contact inserted.

2. The electric power steering apparatus according to claim 1,
    wherein the contacts are inserted only to current paths of two phases among the current paths of the three phases, respectively, and
    the current path of the one phase is a current path of one phase having no contact inserted.

3. The electric power steering apparatus according to claim 2,
    wherein the controller determines the positive and negative signs of currents flowing in the respective current paths of the two phases such that a rotation angle of a rotor of the motor from the current position is minimum.

4. The electric power steering apparatus according to claim 1,
    wherein the controller determines, on the driving current waveform, the positive and negative signs of currents flowing in the respective current paths of the two phases such that a rotation angle of a rotor of the motor from the current position is minimum.

5. The electric power steering apparatus according to claim 1,
    wherein the electric power steering apparatus includes a reducer and a value obtained by multiplying a reduction ratio with a motor pole number is 90 or more.

6. The electric power steering apparatus according to claim 1,
    wherein the contacts are inserted to all of the current paths of the three phases, respectively, and
    the controller performs the conduction check process based on two stages among which a first stage is performed by the controller to carry out the conduction check process by using one phase that has an electric angle nearest to the current position of a rotor of the motor and that has a current value of 0 on a driving current waveform of the three-phase brushless motor as a current path in which no current flows and a second stage is performed by the controller to carry out the conduction check process by using the other one phase that has an electric angle nearest to the electric angle in the first stage and that has a current value of 0 of the other one phase as a current path in which no current flows.

7. The electric power steering apparatus according to claim 1, wherein the contacts are inserted to all of the current paths of the three phases, respectively, the controller performs the conduction check process based on two stages among which a first stage is performed by the controller to carry out the conduction check process by using a first phase as a current path in which no current flows and a second stage is performed by the controller to carry out the conduction check process by using any one phase among a second phase and a third phase as a current path in which no current flows.

* * * * *

UNITED STATES PATENT AND TRADEMARK OFFICE
CERTIFICATE OF CORRECTION

PATENT NO. : 8,538,632 B2
APPLICATION NO. : 12/289102
DATED : September 17, 2013
INVENTOR(S) : Takamatsu et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1046 days.

Signed and Sealed this
Twentieth Day of October, 2015

Michelle K. Lee
*Director of the United States Patent and Trademark Office*